United States Patent
Peng et al.

(10) Patent No.: US 10,074,168 B2
(45) Date of Patent: Sep. 11, 2018

(54) ARC DETECTION METHOD

(71) Applicant: DTI Group Limited, Western Australia (AU)

(72) Inventors: En Peng, Western Australia (AU); William Hock Oon Lau, Western Australia (AU); Brett Adams, Western Australia (AU)

(73) Assignee: DTI GROUP LIMITED, Western Australia (AU)

( * ) Notice: Subject to any disclaimer, the term of this patent is extended or adjusted under 35 U.S.C. 154(b) by 76 days.

(21) Appl. No.: 15/123,715

(22) PCT Filed: Aug. 11, 2015

(86) PCT No.: PCT/AU2015/050455
§ 371 (c)(1),
(2) Date: Sep. 6, 2016

(87) PCT Pub. No.: WO2016/040998
PCT Pub. Date: Mar. 24, 2016

(65) Prior Publication Data
US 2017/0024880 A1    Jan. 26, 2017

(30) Foreign Application Priority Data
Sep. 15, 2014   (AU) ................................ 2014903671

(51) Int. Cl.
*G06K 9/00*    (2006.01)
*G06T 7/00*    (2017.01)
(Continued)

(52) U.S. Cl.
CPC ............. *G06T 7/0008* (2013.01); *B60M 1/28* (2013.01); *G01R 31/008* (2013.01); *G01R 31/12* (2013.01);
(Continued)

(58) Field of Classification Search
None
See application file for complete search history.

(56) References Cited

U.S. PATENT DOCUMENTS

2007/0108990 A1    5/2007    Oguchi et al.
2008/0291040 A1*   11/2008   Cutsforth ........... G05B 23/0232
                                                                 340/653

FOREIGN PATENT DOCUMENTS

KR    1020070043209 A    4/2007

OTHER PUBLICATIONS

International Search Report for PCT/AU2015/050455 dated Oct. 6, 2015.
(Continued)

*Primary Examiner* — Idowu O Osifade
(74) *Attorney, Agent, or Firm* — Pearne & Gordon LLP

(57) ABSTRACT

A method of detecting arcing between two electrical conductors the method including generating an image of the electrical conductors; determining a region of interest in the image where arcing between the electrical conductors is likely to occur, isolating the region of interest processing arcing candidates captured in the image and falling within the region of interest to screen the arcing candidates to reject artifacts likely to have been caused by factors other than arcing, and validating that a selected arcing candidate is an arc by further processing the selected arcing candidate.

21 Claims, 7 Drawing Sheets

(51) Int. Cl.
   *B60M 1/28* (2006.01)
   *G06T 7/64* (2017.01)
   *G01R 31/00* (2006.01)
   *G01R 31/12* (2006.01)
   *G06K 9/32* (2006.01)
   *B60L 5/00* (2006.01)
   *H01H 9/50* (2006.01)

(52) U.S. Cl.
   CPC ............ *G06K 9/3233* (2013.01); *G06T 7/001* (2013.01); *G06T 7/64* (2017.01); *B60L 5/00* (2013.01); *G06T 2207/20021* (2013.01); *G06T 2207/30108* (2013.01); *G06T 2210/12* (2013.01); *H01H 9/50* (2013.01)

(56) References Cited

OTHER PUBLICATIONS

Reissued International Search Report and Written Opinion for PCT/AU2015/050455 dated Nov. 19, 2015.
Written Opinion for PCT/AU2015/050455 dated Nov. 19, 2015.
Written Opinion of the International Preliminary Examining Authority PCT/AU2015/050455 dated Jul. 22, 2016.
Guerreiro, R. et al., 'Connectivity-enforcing Hough transform for the robust extraction of line segments' IEEE Transactions on Image Processing, (Jun. 5, 2012): 4819-4829.
Landi, A et al., 'Hough transform and thermo-vision for monitoring pantograph-catenary system', Proceedings of the Institution of Mechanical Engineers, Part F: Journal of Rail and Rapid Transit 220.4 (Dec. 2006): 435-447.

* cited by examiner

ARC DETECTION METHOD

CROSS-REFERENCE TO RELATED APPLICATIONS

This application is a national phase application under 35 U.S.C. § 371 of International Application No. PCT/AU2015/050455 filed 11 Aug. 2015, which claims the benefit of Australian Provisional Patent Application No 2014903671 filed on 15 Sep. 2014, the contents of which are incorporated herein by reference in their entirety.

TECHNICAL FIELD

This disclosure relates, generally, to the field of arc detection and, more particularly, to a method of, and a system for, detecting arcing between two electrical conductors. The electrical conductors may comprise a power supply line and a conductive follower in electrical contact with the line. The disclosure has particular, but not necessarily exclusive, application to electric transportation vehicles powered via an overhead power line.

BACKGROUND

It is desirable to monitor contact between an electrical power supply line and an electrically conductive follower (the "conductor") to assess the integrity of contact between the line and the conductor. Poor contact manifests as arcing and may arise due to a number of factors such as a worn or damaged conductor or line. Poor contact can adversely affect performance and can lead to vehicle breakdowns or have other negative consequences including injury to persons and/or damage to equipment.

In monitoring an electrical system comprising the overhead power supply line and the conductor, an image capture device may detect multiple arcing candidates. Some of these arcing candidates may be false positives arising from incident light on the system, ghosting, etc. In other words, some of the candidates are not arcs but artefacts arising due to other causes.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

SUMMARY

In a first aspect, there is provided a method of detecting arcing between two electrical conductors, the method including
    generating an image of the electrical conductors;
    determining a region of interest in the image where arcing between the electrical conductors is likely to occur;
    isolating the region of interest;
    processing arcing candidates captured in the image and falling within the region of interest to screen the arcing candidates to reject artefacts likely to have been caused by factors other than arcing; and
    validating that a selected arcing candidate is an arc by further processing the selected arcing candidate.

Artefacts that arise due to factors other than arcing may be caused by issues such as sudden changes in lighting conditions, e.g. when a vehicle moves out of a tunnel, reflections, or the like.

The method may include isolating the region of interest by generating a bounding polygon surrounding a likely contact region between the electrical conductors.

The method may include determining a first, inner region of interest and a second, outer region of interest from the polygon. The method may include determining the first region of interest by expanding the bounding polygon so that the first region of interest is a first, expanded polygon surrounding the bounding polygon and determining the second region of interest by expanding the first, expanded polygon to form a second, further expanded polygon surrounding the first, expanded polygon.

Processing the arcing candidates to screen the arcing candidates may comprise determining if a number of image components of the image, having a predetermined characteristic in a first sub-region of the image, exceeds a pre-defined threshold and determining if a number of image components of the image, having the same characteristic, is present in a second sub-region of the image.

The method may include rejecting the arcing candidate if the number of image components having the characteristic in the second sub-region of the image either exceeds the pre-defined threshold or the number of image components in the second sub-region having the characteristic exceeds the number of image components in the first sub-region having the characteristic.

The predetermined characteristic may be intensity/brightness of the image components in the sub-region. Since a spark due to arcing will typically result in complete saturation of the luminance component of the relevant pixel/s (the "image component/s") at the centre of the spark, the intensity/brightness threshold is typically about 254 or 255 in a range [0, 255]. The number of relevant image components in the first sub-region of the image is typically Max $(1, \pi r_{in}^2)$ where $r_{in}$ is the radius of an inner circle defining the inner sub-region of the image.

The method may include using a masking technique to determine if the image component constitutes a centre of the arcing candidate captured in the image. More particularly, the method may include using a double circle mask as the masking technique, the double circle mask having an inner circle defining the first sub-region and an outer circle defining the second sub-region and the method may include scanning each image component of the inner circle to determine if that image component complies with a first intensity threshold requirement and rejecting the arcing candidate if it does not comply with the threshold requirement.

The method may include further scanning each image component of the outer circle and rejecting the arcing candidate if the number of image components does not comply with a second intensity threshold requirement and selecting the arcing candidate as a likely arc if both the first intensity threshold requirement and the second intensity threshold requirement are met.

The further processing of the selected candidate may comprise determining if a representation of one of the electrical conductors is present within the region of interest. The method may include validating that the selected arcing candidate is an arc by determining if a line representative of one of the electrical conductors is present in the image within the region of interest. Further, the method may include determining if the line is present using a multiple circle masking technique.

The method may include superimposing a multiple circle mask over the image. The method may include dividing the multiple circle mask into a plurality of angle bins and iterating through each angle bin until that angle bin with a number of votes over a minimum threshold vote has been found to confirm that the selected arcing candidate is an arc and rejecting the arcing candidate as a false positive if no angle bin having at least the minimum threshold vote is located.

In a second aspect, there is provided a computer software program, including machine-readable instructions, which, when executed by a processor, causes the processor to perform the method described above.

In a third aspect, there is provided a system for detecting arcing between two electrical conductors, the system including at least one image capture device for capturing an image of the electrical conductors; and a processor in communication with the at least one image capture device, the processor being configured to:
  determine a region of interest in the image where arcing between the electrical conductors is likely to occur;
  isolate the region of interest;
  process arcing candidates captured in the image and falling within the region of interest to screen the arcing candidates to reject artefacts likely to have been caused by factors other than arcing; and
  validate that a selected arcing candidate is an arc by further processing the selected arcing candidate.

BRIEF DESCRIPTION OF DRAWINGS

An embodiment of the disclosure is now described by way of example with reference to the accompanying drawings in which.

DETAILED DESCRIPTION OF EXEMPLARY EMBODIMENTS

Figure 1:
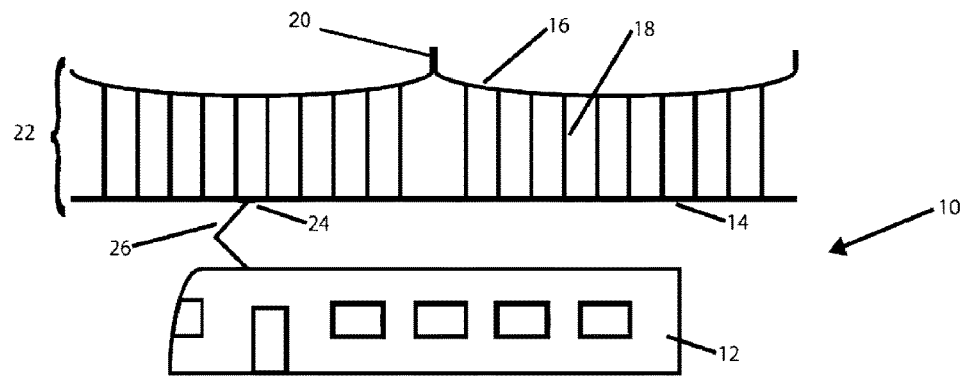
FIG. 1 shows a schematic representation of an electrical vehicle powered via an overhead power line.

In FIG. 1 of the drawings, reference numeral 10 generally designates an electrical power supply for an electrically powered vehicle 12. As illustrated, the electrically powered vehicle 12 is a train but it will be appreciated that the electrically powered vehicle 12 could be any other suitable vehicle such as a tram, an electrically powered mining vehicle, or the like.

The power supply 10 comprises a contact wire or power supply line 14 suspended from a messenger wire 16 via a plurality of dropper wires 18. The messenger wire 16, in turn, is suspended from a plurality of suspension points 20 to form a catenary 22. The train 12 includes a contactor or conductor 24 carried on a pantograph 26 which acts as a follower following the catenary 22 imparted to the contact wire 14. The conductor 24 is, for example, a carbon strip carried on the pantograph 26.

Figure 2:
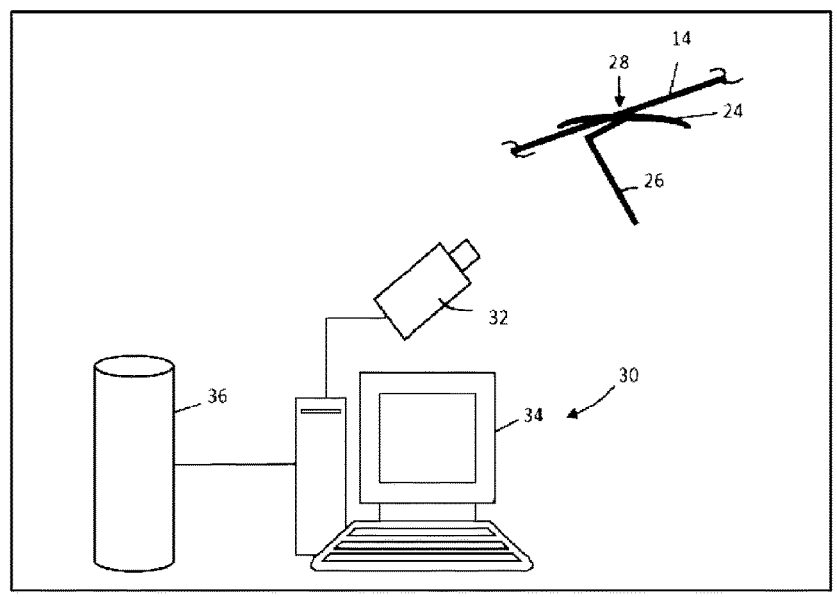
FIG. 2 shows a block diagram of an embodiment of a system for detecting arcing between two electrical conductors.

As shown more clearly in FIG. 2 of the drawings, a point where the contact wire 14 makes contact with the conductor 24 defines a region of interest 28.

In FIG. 2 of the drawings, reference numeral 30 generally designates an embodiment of a system for detecting arcing between two electrical conductors, more particularly, the contact wire 14 and the conductor 24. In particular, the system 30 is used for detecting arcing at the region of interest 28.

The system 30 includes at least one image capture device in the form of a camera 32. The camera 32 is connected to a processor 34, illustrated schematically as a computer in FIG. 2 of the drawings. The system 34 further includes a memory 36 in which a program for the computer 34 is stored, the memory 36 further serving to store data captured by the camera 32 and processed by the computer 34 as described in greater detail below.

While the components 32, 34 and 36 are shown as being hardwired, it will be appreciated that, for example, the camera 32 communicates wirelessly with the computer 34 and/or that the memory 36 is a removable device which can be removed from the computer 34 for subsequent operations to be carried out on the data stored in the memory 36. The system 30 could also be a distributed system.

Figure 6:
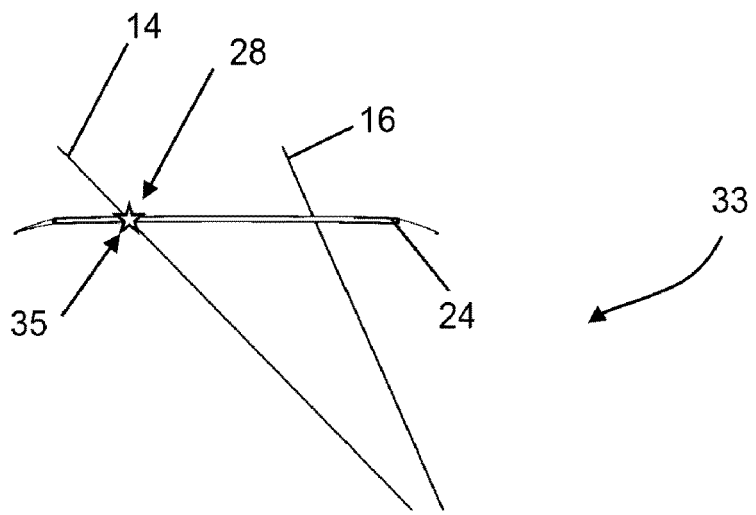
FIG. 6 shows an input greyscale image input into the system of FIG. 2.
Figure 7:
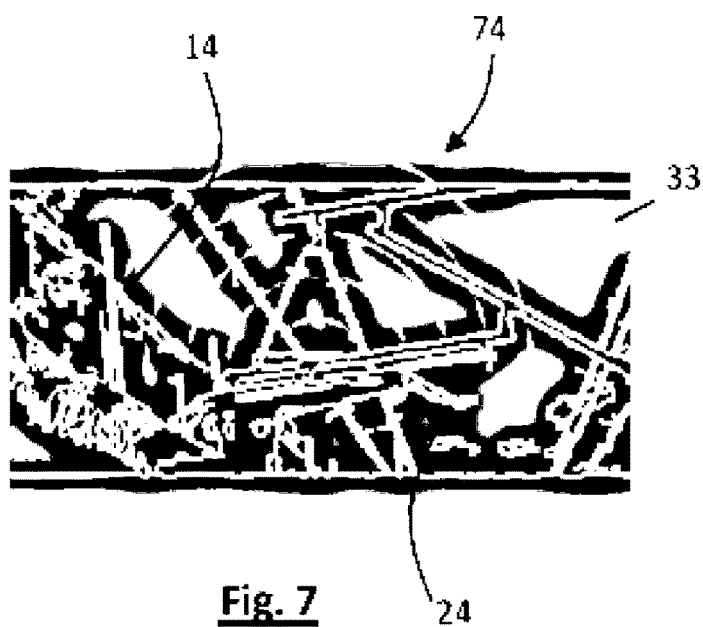
FIG. 7 shows a representation of a processed version of the image of FIG. 6 with the multiple circle mask of FIG. 5 superimposed thereon.
Figure 9:
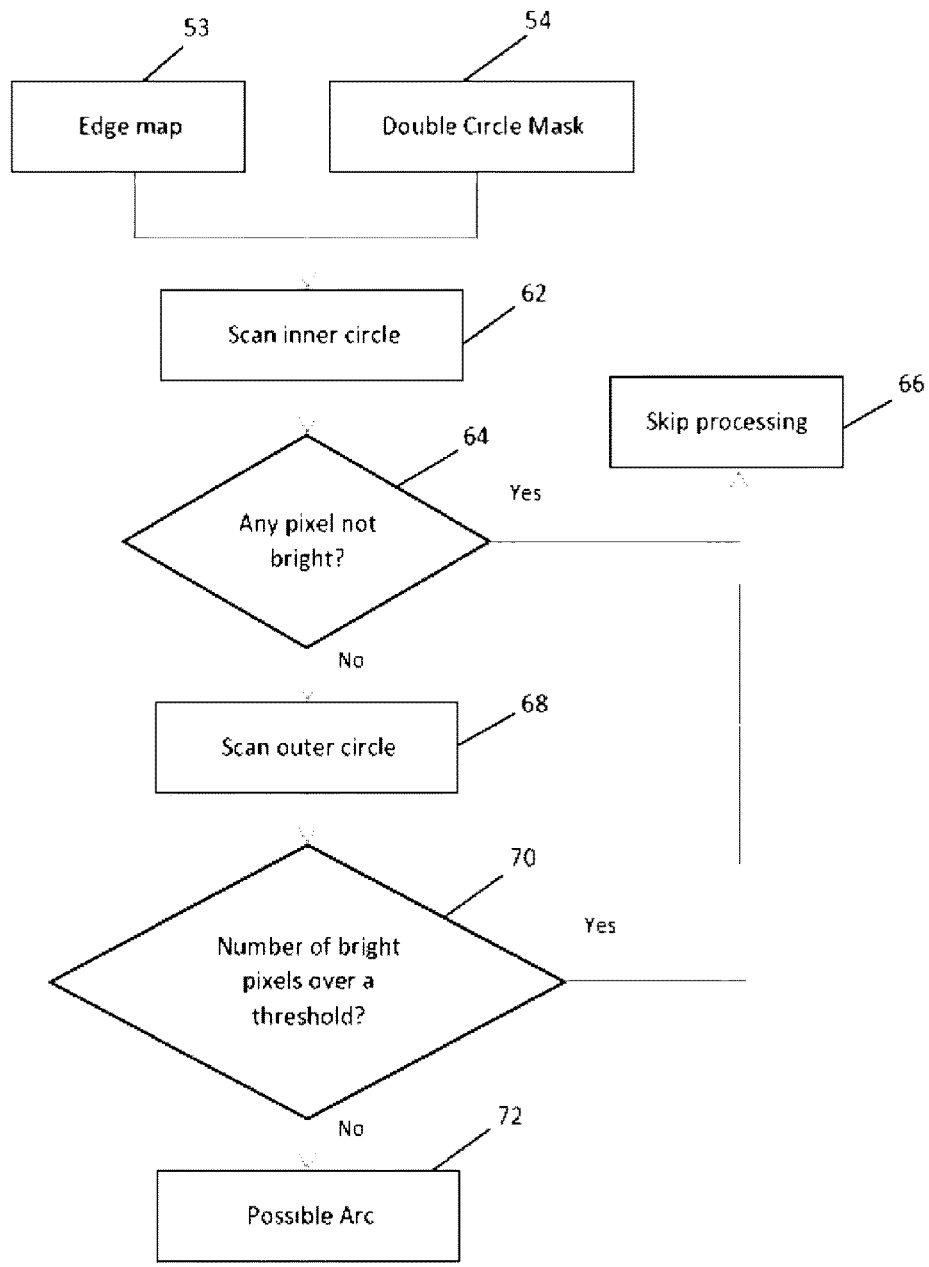
FIG. 9 shows a flow chart of further steps of the method to select an arcing candidate.

The camera 32 is used to capture an image 33 (FIGS. 3 & 6) of the region of interest 28. The image 33 is a greyscale image to be used by the processor 34 of the system 30 in determining whether or not an arcing candidate 35 (FIG. 6) in the image 33 is an arc. FIG. 7 of the drawings illustrates the image 33 after it has been converted using an edge mapping technique or edge map 53 (FIG. 9).

Figure 3:
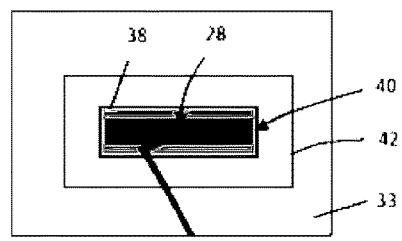
FIG. 3 shows a schematic representation of determining a region of interest for use in the system of FIG. 2.

As an initial step in determining whether or not arcing is occurring in the region of interest 28, a bounding polygon or box 38 (FIG. 3) is generated and is superimposed on the image 33. This bounding box 38 is generated based on the expected limits of movement of the pantograph 26. Thus, as illustrated in FIG. 3 of the drawings, the bounding box 38 is defined around the conductor 24 and encompasses the region of interest 28.

It is to be noted that, if contact point localization by generating the region of interest 28 were not performed for any reason, the region of interest would be larger and it might introduce a larger number of false positives. Thus, by constraining the region of interest 28 to a region closely bounding the pantograph 26, the likelihood of false positives occurring is reduced.

The processor 34 of the system 30 is configured to generate two sub-regions associated with the region of interest 28. The two sub-regions are, firstly, an inner region of interest 40 where arcing is likely to occur and an outer region of interest 42 to which an arc is less likely to spread.

The processor 34 generates the inner region of interest 40 by expanding the bounding box 38 using predefined parameters which include pixels within the bounding box 38. The processor 34 generates the outer region of interest 42 by expanding the inner region of interest 40 using predefined parameters where pixels within the inner region of interest 40 are excluded.

In practice, the inner and outer regions of interest 40, 42 are pre-defined empirically. It depends on how tight the optimal sub-window is. This in turn depends on the ratio of positive weights to negative weights used in determining whether or not a pantograph is present in an image as described in our co-pending application entitled: "Identification of a pantograph represented in an image", Australian provisional patent application No. 2014903664 dated 15 Sep. 2015. The contents of Application No. 2014903664 are incorporated herein by reference in their entirety.

More particularly, determination of whether or not the pantograph is present in the regions of interest involves the processor 34 scanning the image 33 in a direction of parallel lines extending substantially perpendicularly through the pantograph 26, more particularly, substantially perpendicularly to an edge representative of a top of the pantograph 26. In this example, the line is a one-point or one-pixel width line.

Figure 11:
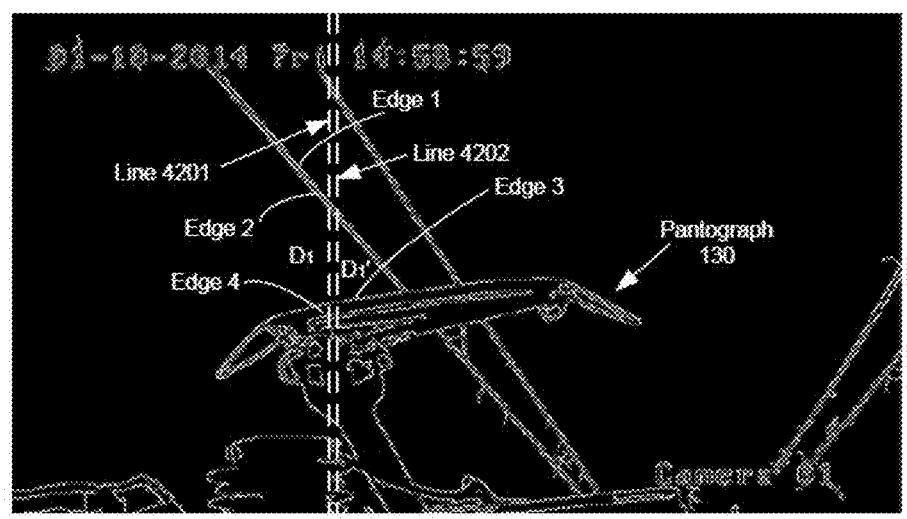
FIG. 11 is an example image representing edges of a pantograph that is captured by a camera.

Referring to FIG. 11, the edges extracted by an edge detector may have single point or pixel width. As a result, an image 420 is generated that is representative of the edges in an image captured by the camera. It can be seen from FIG. 11 that two edges in the edges in the image 420 may be adjacent edges. Specifically, "adjacent edges" in the present disclosure refer to a pair of edges without any edge therebetween when viewed along a line. Take four edges 1, 2, 3 and 4 shown in FIG. 11 as an example, the edges 1 and 2, the edges 2 and 3, the edges 3 and 4 are three pairs of adjacent edges along a line 4201, shown as a dashed line in FIG. 11. The line may be a vertical straight line with one-point width. It should be noted that a pair of edges may be adjacent edges when viewed along a line, but the pair of edges may not be adjacent edges when viewed along another line.

The processor 34 identifies a plurality of pairs of adjacent edges along each line in the image 33 and determines a distance in the direction of the line between each of the adjacent edge pairs along the line in an effort to distinguish edges representative of opposite sides of the contact wire 14 from edges representing opposite sides of the pantograph 26. For example, the distance between the operatively lower pair of edges representing the contact wire 14 and the operatively upper edge of the operatively upper edge of the edge pair representing the pantograph 26 along the line is given as $D_1$.

The processor 34 repeats the above process along each of the lines. The distance along a second of the lines between the operatively lower pair of edges representing the contact wire 14 and the operatively upper edge of the operatively upper edge of the edge pair representing the pantograph 26 along the second of the lines is given as $D_1'$.

The processor 34 scans the image 33 along all the parallel vertical lines as described above. These vertical lines may be evenly spaced or may be spaced apart in some other way. Thus, for each pair of adjacent edges represented in the image, the processor 34 can determine a plurality of distances between the adjacent edges along each line. In other examples, the scanning process described above may only be performed on that portion of the image 33 in which the pantograph 26 is anticipated to be located in order to reduce the computing burden of the processor 34 and to speed up the scanning process.

For each of the plurality of distances between the adjacent edges, the processor 34 determines a point weight for points of the image associated with the distance by comparing the distance to the value or the value range representing the dimensions of the pantograph 26. In the present disclosure, the points associated with the distance are the points located on or near a line segment that forms the distance between the pair of the adjacent edges.

More particularly, the processor 34 compares each of the distances, for example $D_1$ and $D_1'$, with a value range $[D_{min}, D_{max}]$ that represents the thickness of the pantograph 26. The points associated with the distance $D_1$ are points located on or near a line segment of the first line. One end point of the line segment is the intersection point between the line and the edge representative of the lower edge of the contact wire 14, and another end point of the line segment is the intersection point between the line and the edge representative of the upper edge of the pantograph 26. The length of the line segment forms the distance between the pair of the adjacent edges along the line.

A similar exercise is carried out by the processor 34 for points associated with the distance $D_1'$ for the second of the lines and so on.

In respect of each line, if the distance is within the value range $[D_{min}, D_{max}]$, the points associated with the distance are identified as points of interest and a positive point weight is allocated to those points. On the other hand, a negative point weight is allocated to those points if their distance is outside the value range $[D_{min}, D_{max}]$. In this example, the positive point weight for the points of interest is +10, and the negative point weight for non-points of interest is −1.

Therefore, the point weight for a point (p) may be expressed by the following equation (1):

$$\text{weight}(p) = \begin{cases} +10, & p \text{ is a point of interest} \\ -1, & \text{otherwise} \end{cases} \quad (1)$$

In the above example, the distance between the adjacent edges representative of the upper and lower edges of the pantograph 26 fall within the value range $[D_{min}, D_{max}]$, while the distance between the remaining adjacent edge pairs each fall outside the value range $[D_{min}, D_{max}]$. As a result, the points allocated to the edge pairs representative of the upper and lower edges of the pantograph 26 along each line are identified as the points of interest and the positive point weight of +10 is allocated to those points, while the negative point weight of −1 is assigned to the points associated with the remaining edge pairs.

The processor 34 determines, based on the point weights for the points in the image 33, a region $R_{optimal}$ of the image 33 that represents the pantograph 26. Specifically, the processor 34 determines a sum of point weights of points in the region of interest 28 in the image 33, i.e., where the pantograph 26 is located, is greater than a sum of point weights of points in other regions of the image 33. The sum of point weights of points in the region $R_{optimal}$ that is acceptable may fall within a predetermined range. As indicated above, the region of interest 28 is a region that tightly contains the pantograph 26.

To determine the region $R_{optimal}$, a quality function $f(R)$ of the image region 28 in the image 33 is defined by the following equation (2):

$$f(R) = \sum_{p \in R} \text{weight}(p) \quad (2)$$

The result of quality function $f(R)$ represents a sum of point weights of the points in the image region 28.

Further, the region $R_{optimal}$ may be defined by the following equation (3):

$$R_{optimal} = \sum_{R \subset I} \mathrm{argmax} f(R) \quad (3)$$

That is, the region $R_{optimal}$ represents a region in the image 33 that has a maximum sum of point weights. The region $R_{optimal}$ may be obtained by applying a sub-window search algorithm for example I-ESS described in An, Senjian An, P. Peursum, Wanquan Liu, S. Venkatesh, "*Efficient algorithms for subwindow search in object detection and localization*" cvpr, pp. 264-271, 2009 IEEE Conference on Computer Vision and Pattern Recognition, 2009.

By applying equations (2) and (3) to the point weights of points in the image 33, the region $R_{optimal}$ may be obtained, the region $R_{optimal}$ containing the pantograph 26 and the boundary of the region $R_{optimal}$, representing the region of interest 28 tightly surrounding the pantograph 26.

Hence, as described above and in our referenced co-pending application, determining the point weight for the points of the image 33 associated with edge pair spacings comprises determining a positive point weight for the points associated with the edge pair spacings if that edge pair spacing is within the value range; and determining a negative point weight for the points associated with that edge pair spacing if the edge pair spacing is outside the value range.

Once the pantograph 26 has been identified in the image 33, the pre-defined parameters ensure that the inner region of interest 40 will be the region around the pantograph 33 where the arcing is likely to occur; and another set of pre-defined parameters will ensure that the outer region of interest 42 will be the region to which the spark is likely to spread. These parameters will differ from customer to customer depending on variations in camera/pantograph mounting positions.

In determining whether or not the arcing candidate 35 in the image 33 is an arc, the processor 34 is configured to screen the arcing candidate 35. This screening is performed using a greyscale histogram of the image 33 as shown at 44 in FIG. 8 of the drawings. Where there is a possible arc, there will be at least one pixel with a high intensity within the inner region of interest 40.

Conversely, pixels associated with the possible arcing candidate 35 occurring in the outer region of interest 42 will have a far lower intensity than the pixels within the inner region of interest 40.

In the screening process, the following parameters are set:
$R_{in}$ is denoted as the image sub-region (the inner region of interest 40) where the main centre of an arc is likely to occur.
$R_{out}$ is denoted as the image sub-region (the outer region of interest 42) where the residual of an arc is likely to occur, and $R_{out} \cap R_{in} = \emptyset$.
$W_{in}$ is denoted as the set of pixels with very high intensity within $R_{in}$.
$W_{out}$ is denoted as the pixels with very high intensity within $R_{out}$.

Figure 8:
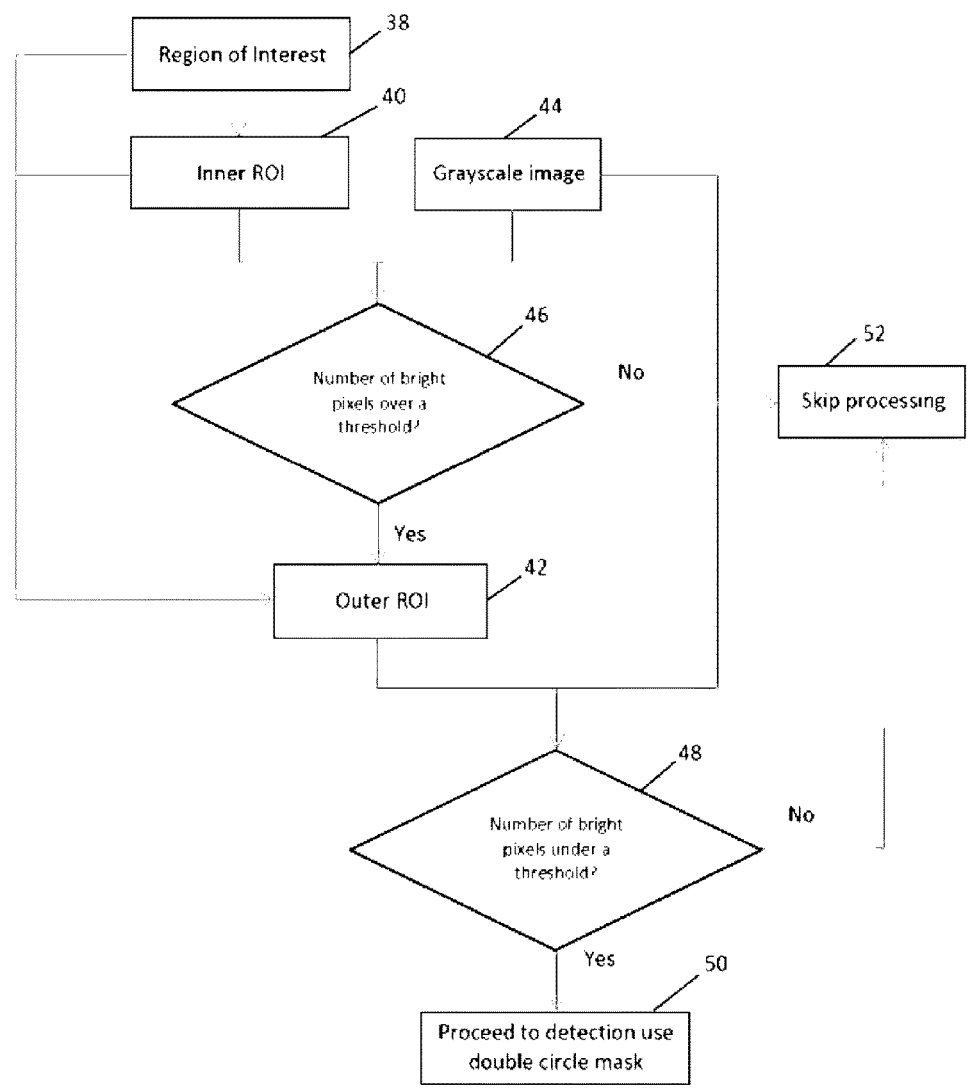
FIG. 8 shows a flow chart of initial steps of an embodiment of a method for detecting arcing between two electrical conductors, the initial steps showing screening of arcing candidates.

The screening process to determine if a possible arc exists comprises:
firstly, as shown at step 46 in FIG. 8 of the drawings, scanning each pixel within $R_{in}$ and counting the number of very bright pixels and, if the number count exceeds a predefined threshold, then
as shown at step 48, scanning each pixel within $R_{out}$ and counting the number of very bright pixels; and
if the number of very bright pixels in the outer region of interest 42 is under the threshold or is less than $|W_{in}|$, proceeding with further processing of the arcing candidate 35 as shown at step 50. Conversely, if the very bright pixel count in the outer region of interest 42 exceeds $|W_{in}|$ or the pre-defined threshold, rejecting the arcing candidate 35 as an arc as shown at step 52 in FIG. 8 of the drawings.

This approach facilitates rejection of arcing candidates which may give false positives such as artefacts with bright backgrounds, usually due to sudden changes in lighting conditions (e.g. when the train 12 moves out of a tunnel).

Figure 4:
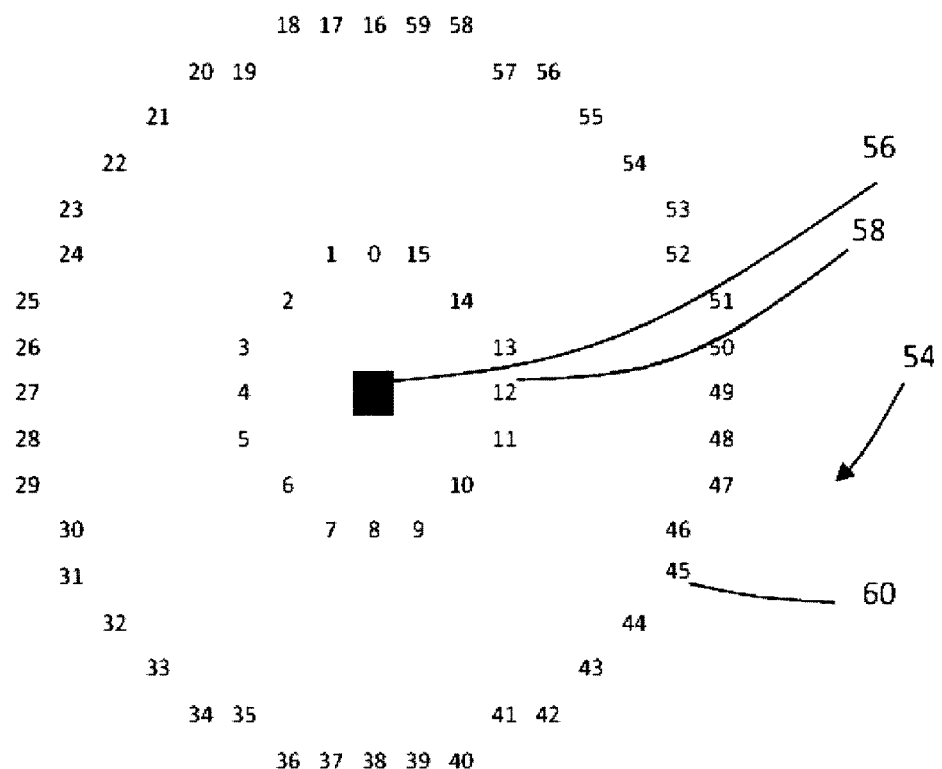
FIG. 4 shows a double circle mask for arc detection for use in the system of FIG. 2.

The next step in the processing involves arc detection using a masking technique, more particularly, using a double circle mask as shown at 54 in FIG. 4 of the drawings.

In using the double circle mask 54, the assumption is made that most arcs have a very bright centre which is usually circular in shape whereas arc residuals can have irregular shapes. However, the further one is from the centre of the arc, the less arc residual one is likely to encounter.

In the double circle mask 54 of FIG. 4, a centre 56 of an inner circle 58 of the mask 54 is the pixel being tested against.

The following criteria are set:
$T_{high}$ is denoted as the minimum intensity threshold of a possible arc pixel;
$T_{low}$ is denoted as the maximum intensity threshold of a possible background pixel;
$r_{in}$ is denoted as the expected radius of the circle (inner circle 58) that contains all arc pixels;
$r_{out}$ is denoted as the expected radius of the circle (outer circle 60) that passes through all background pixels;
I is denoted as the input grayscale image;
$I_{inner}$ is denoted as the inner region of interest 40 of the grayscale image;
$C_r(p)$ is denoted as the set of all pixels on the circle centred at p with radius r;
$E_r(p)$ is denoted as all pixels on or inside the circle centred at p with radius r.

Ideally, a pixel $p \in I_{inner}$ will be considered as the centre of an arc if:

$$\begin{cases} \forall\, p' \in E_{r_{in}}(p): I(p') \geq T_{high} \\ \exists\, r(r_{in} \leq r \leq r_{out}): \forall\, p' \in E_r(p): I(p') \leq T_{low} \end{cases} \quad (4)$$

Practically, it is not necessary to validate all pixels within the arc centre. Further, it is reasonable to assume that the residual of the arc would possibly extend very far from its centre and would exceed the expected radius r.

To detect an arc efficiently and robustly and, for the purpose of fast rejection of non-arc centre pixels, the processor 34 only needs to validate the pixels on the circle with radius and abort if a non-arc pixel is hit. Further, for the purpose of tolerating arc residuals, it is not required that all pixels on the outer circle 60 be background pixels.

Therefore, denoting $N_r(p) \subseteq C_r(p)$ as all the non-background pixels on the circle centred at p with radius r, and denoting $t_{nbg}$ as the tolerance threshold of non-background pixels on a circle, the criteria to determine if p is an arc centre are:

$$\begin{cases} \forall\, p' \in C_{r_{in}}(p)\colon I(p') \geq T_{high} \\ \dfrac{|N_{r_{out}}(p)|}{|C_{r_{out}}(p)|} \leq t_{nbg} \text{ where } \forall\, p' \in N_{r_{out}}(p)\colon I(p') > T_{low} \end{cases} \quad (5)$$

Thus, the scanning process using the double circle mask 54 comprises, firstly, scanning each pixel on the inner circle 58 as shown at step 62 in FIG. 9 of the drawings to validate that $I(p') \geq T_{high}$ as shown at step 64. If the scanned pixel is below the threshold of $T_{high}$, the processor 34 aborts the scanning process as shown at step 66.

If the scanned pixel meets the threshold of $T_{high}$, each pixel on the outer circle 60 of the double circle mask 54 is scanned as shown at step 68. The processor 34 counts the number of non-background pixels to determine if $I(p') > T_{low}$ and aborts the scanning process if the number count of bright pixels exceeds the threshold value of $t_{nbg}|C_{r_{out}}|$ as shown at step 70.

If the number count does not exceed this threshold value, the processor 34 flags the arcing candidate 35 as a possible arc as shown at step 72.

The processor 34 then proceeds with validating that the arcing candidate 35 is an arc by further processing the arcing candidate 35 as is now described with reference to FIG. 10 of the drawings.

Figure 5:
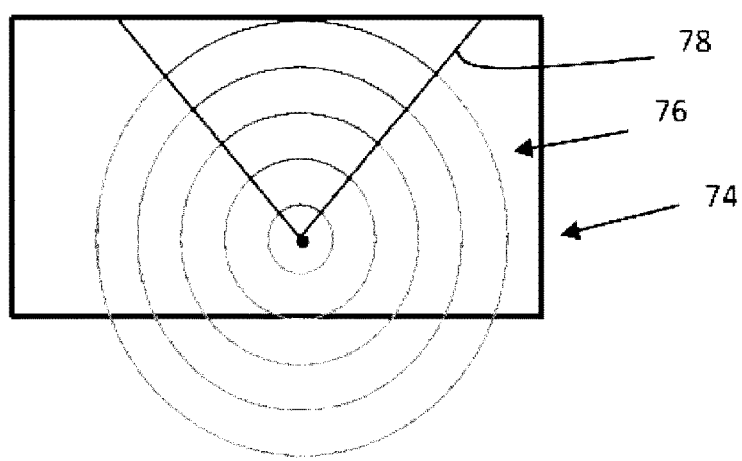
FIG. 5 shows a multiple circle mask for use in the system of FIG. 2 for further processing a selected arcing candidate to validate that it is an arc.

Further processing of the arcing candidate 35 involves the use of a multiple circle mask technique using a multiple circle mask 74 as shown in FIG. 5 of the drawings. The use of a multiple circle mask 74 is based on the observation that any arc will stay on the overhead power line 14 for a very short period of time as the train 12 moves. Therefore, if an approximation of a straight line is detected which passes through the possible arc, the arcing candidate 35 is very likely to be a true positive, i.e. an arc.

One possibility for detecting an approximately straight line in an image is the use of a Hough transform algorithm. A disadvantage of the use of the Hough transform algorithm is that the algorithm is computationally expensive. The algorithm needs, firstly, to scan through all image pixels for edge points, secondly, the distance (i.e. perpendicular distance to the origin) needs to be computed at every possible angle at each edge point for voting in a 2D accumulator space, and, thirdly, by searching for the local maxima in the accumulator space, the most likely lines can be extracted. As a result, the algorithm may detect a number of lines that do not pass through the possible arc.

To minimize the CPU consumption of the processor 34 on line detection for arc validation, the processor 34 users the multiple circle mask 74. Use of the multiple circle mask 74 aims to address the three main issues described above associated with the Hough transform algorithm and provides the following advantages: the processor 34 only needs to scan through a small portion of pixels around the possible arc for edge points; the processor 34 only needs to compute one angle per edge point at runtime for voting in a 1D accumulator space. A pre-computed angle map can also be used to eliminate the runtime computation.

The maximum vote for each angle bin in the accumulator space is the number of circles used in the mask 74. Thus, if the number of votes in one angle bin has hit the pre-defined threshold, it can be expected that a line has been found that passes through the possible arc and there is no need to go through the remaining bins.

In greater detail, the multiple circle mask 74 consists of n dynamic circles based on the location of the possible arc. Because the overhead power line 14 is usually distinguishable above the conductor 24 in the image 33 and assuming the location of the arc candidate 35 is M(x, y), the radius of each circle is defined as follows:

$$r_i = \frac{y}{n} i \text{ where } i = 1, 2, \ldots, n \quad (6)$$

With constraints on the incline angle range, $[\theta_{min}, \theta_{max}]$, of the overhead power line 14 that usually appears in the image 33, only a small number of pixels, i.e. those pixels in the specified segment of the circle, will be involved. The pixels along the circle are determined via a Midpoint circle algorithm. The illustrated multiple circle mask 54 shows the case where $$n = 5,\ \theta_{min} = -\frac{\pi}{4} \text{ and } \theta_{max} = \frac{\pi}{4}:$$

only the pixels on the circles 76 within the shaded triangle 78 are to be analysed. The optimal scan method is to start with the pixels nearest to the centre of the arcing candidate 35 for quick rejection.

For each pixel along the circles 76, the processor 34 computes its angle in relation to the arcing candidate 35 with the angle range of $[-\pi, \pi]$. The difference in angle for neighbouring pixels on the circle is also considered and, therefore, the tolerance of a pixel on a circle with radius r is defined as follows:

$$\delta_r = \frac{\pi}{8r\cos\dfrac{\pi}{4}} \quad (7)$$

Figure 10:
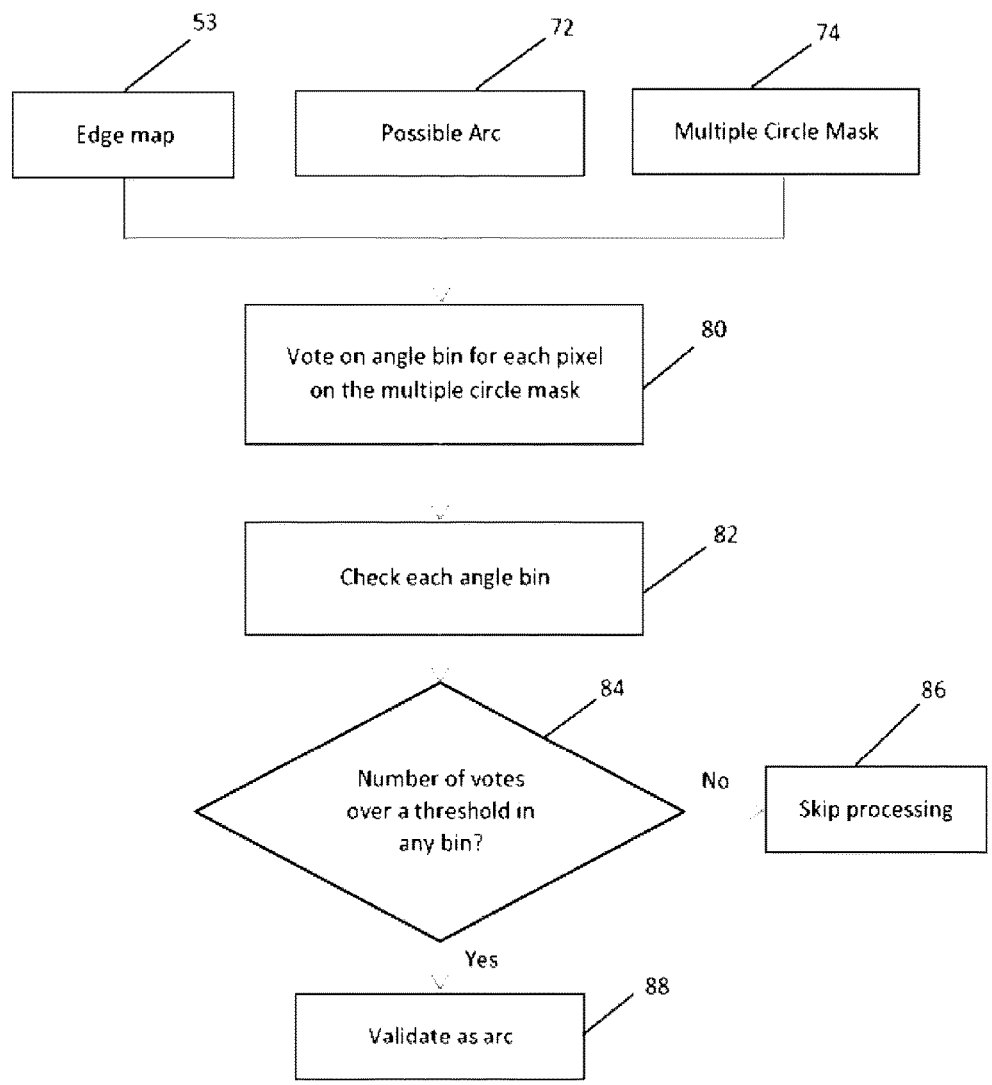
FIG. 10 shows a flow chart of still further steps of the method to validate that a selected arcing candidate is an arc.

Thus, if a pixel on the circle with radius r maps to an angle $\theta$, the angle bin that intersects $[\theta-\delta_r, \theta+\delta_r]$ will get a vote as shown at step 80 in FIG. 10 of the drawings. Each angle bin only accepts one vote from each circle.

The number of angle bins can be adjusted based on user requirements or the required accuracy. Generally, each bin should cover a range of at least 2° for robustness.

To detect if a line has been found, the processor 34 iterates through all angle bins, as shown at step 82, until a bin with the required number of votes is located as shown at step 84 in FIG. 10 of the drawings. If none of the bins satisfies the threshold criterion, the processor 34 determines that there is no overhead power line 14 passing through the possible arc, and therefore determines that the arcing candidate 35 is a false positive as shown at step 86. Conversely, if the criterion is satisfied, i.e. that there is a line passing through the arcing candidate 35, the processor 34 validates the arcing candidate 35 as an arc as shown at step 88.

It is an advantage of the described embodiment that arc detection can be done using a single, low cost image capture device. Also, the method of detecting arcing is robust and computationally inexpensive to perform.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

What is claimed is:

1. A method of detecting arcing between two electrical conductors, the method including:
generating an image of the electrical conductors; and
with a processor:
determining a region of interest in the image where arcing between the electrical conductors is likely to occur;
isolating the region of interest;
processing arcing candidates captured in the image and falling within the region of interest to screen the arcing candidates to reject an arcing candidate likely to have been caused by factors other than arcing as a false positive, the arcing candidate being rejected if it is determined:
that a number of image components of the image, having a predetermined characteristic in a first sub-region of the image is below a pre-defined threshold, and
that if a number of image components of the image, having the same characteristic, is present in a second sub-region of the image, then the number of image components having the characteristic in the second sub-region of the image either exceeds the pre-defined threshold or exceeds the number of image components in the first sub-region having the characteristic; and
validating that a selected arcing candidate is an arc by further processing the selected arcing candidate.

2. The method of claim 1 which includes isolating the region of interest by generating a bounding polygon surrounding a likely contact region between the electrical conductors.

3. The method of claim 2 which includes determining the first sub-region and the second sub-region from the polygon.

4. The method of claim 3 which includes determining the first sub-region by expanding the bounding polygon so that the first sub-region of interest is a first, expanded polygon surrounding the bounding polygon and determining the second sub-region by expanding the first, expanded polygon to form a second, further expanded polygon surrounding the first, expanded polygon.

5. The method claim 1 in which processing the arcing candidates to screen the arcing candidates comprises determining if the number of image components of the image, having the predetermined characteristic in the first sub-region of the image, exceeds the pre-defined threshold and determining if the number of image components of the image, having the same characteristic, is present in the second sub-region of the image.

6. The method of claim 5 wherein the image components are pixels and wherein the characteristic is associated with intensity.

7. The method of claim 5 which includes using a masking technique to determine if the image component constitutes a centre of the arcing candidate captured in the image.

8. The method of claim 7 which includes using a double circle mask as the masking technique, the double circle mask having an inner circle defining the first sub-region and an outer circle defining the second sub-region, and the method including scanning each image component of the inner circle to determine if that image component complies with a first intensity threshold requirement and rejecting the arcing candidate if it does not comply with the first intensity threshold requirement.

9. The method of claim 8 which includes further scanning each image component of the outer circle and rejecting the arcing candidate if the number of image components does not comply with a second intensity threshold requirement and selecting the arcing candidate as a likely arc if both the first intensity threshold requirement and the second intensity threshold requirement are met.

10. The method of claim 1 in which the further processing of the selected candidate comprises determining if a representation of one of the electrical conductors is present within the region of interest.

11. The method of claim 10 which includes validating that the selected arcing candidate is an arc by determining if a line representative of one of the electrical conductors is present in the image within the region of interest.

12. The method of claim 11 which includes determining if the line is present using a multiple circle masking technique.

13. The method of claim 12 which includes superimposing a multiple circle mask over the image.

14. The method of claim 13 which includes dividing the multiple circle mask into a plurality of angle bins and iterating through each angle bin until that angle bin with a number of votes over a minimum threshold vote has been found to confirm that the selected arcing candidate is an arc and rejecting the arcing candidate as a false positive if no angle bin having at least the minimum threshold vote is located.

15. A computer software program, including machine-readable instructions, which, when executed by a processor, causes the processor to perform the method of claim 1 on an image of two electrical conductors.

16. The method of claim 1, further comprising detecting the arcing candidates captured in the image and falling within the region of interest.

17. A system for detecting arcing between two electrical conductors, the system including
at least one image capture device for capturing an image of the electrical conductors; and
a processor in communication with the at least one image capture device, the processor being configured to:—
determine a region of interest in the image where arcing between the electrical conductors is likely to occur;
isolate the region of interest;
process arcing candidates captured in the image and falling within the region of interest to screen the arcing candidates to reject an arcing candidate likely to have been caused by factors other than arcing as a false positive, the arcing candidate being rejected if it is determined:
that a number of image components of the image, having a predetermined characteristic in a first sub-region of the image is below a pre-defined threshold, and
that if a number of image components of the image, having the same characteristic, is present in a second sub-region of the image, then the number of image components in the second sub-region having the characteristic exceeds the pre-defined threshold or exceeds the number of image components in the first sub-region having the characteristic; and
validate that a selected arcing candidate is an arc by further processing the selected arcing candidate.

18. A method of detecting a line in an image, the method including
generating a multiple circle mask consisting of a number of circles and overlying the multiple circle mask on the image with a centre of the mask being placed on a predetermined point identified in the image;

dividing the multiple circle mask into a plurality of angle bins;
scanning each angle bin for image components representative of the line by scanning each angle bin from the predetermined point radially outwardly, one circle at a time, scanning for one image component per circle;
determining the number of image components in each angle bin; and
determining if any angle bin has a required number of image components to constitute a representation of a line.

19. The method of claim 18 which includes iterating through each angle bin to determine the number of image components in each angle bin and ceasing further processing as soon as any angle bin with the required number of image components has been detected.

20. The method of claim 18 which includes determining the number of image components in an angle bin using a midpoint circle algorithm.

21. The method of claim 18 wherein each of the plurality of angle bins represents a section of the multiple circle mask with an angle between 2 and 25 degrees.

* * * * *